(12) United States Patent
Yamamoto et al.

(10) Patent No.: US 9,111,875 B2
(45) Date of Patent: Aug. 18, 2015

(54) PATTERN FORMATION METHOD

(71) Applicant: KABUSHIKI KAISHA TOSHIBA, Minato-ku, Tokyo (JP)

(72) Inventors: Hiroshi Yamamoto, Mie-ken (JP); Tsubasa Imamura, Mie-ken (JP); Hisataka Hayashi, Mie-ken (JP); Mitsuhiro Omura, Mie-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/202,494

(22) Filed: Mar. 10, 2014

(65) Prior Publication Data
US 2015/0011089 A1 Jan. 8, 2015

(30) Foreign Application Priority Data
Jul. 8, 2013 (JP) .................................. 2013-142565

(51) Int. Cl.
B44C 1/22 (2006.01)
H01L 21/308 (2006.01)
H01L 21/311 (2006.01)

(52) U.S. Cl.
CPC ........ *H01L 21/3088* (2013.01); *H01L 21/3081* (2013.01); *H01L 21/3086* (2013.01); *H01L 21/31133* (2013.01)

(58) Field of Classification Search
CPC ............ H01L 21/3081; H01L 21/3086; H01L 21/3088; H01L 21/31133; H01L 21/31138
USPC ............................ 216/41, 42, 46, 49; 438/725
See application file for complete search history.

(56) References Cited

U.S. PATENT DOCUMENTS

| | | | |
|---|---|---|---|
| 6,565,763 | B1 | 5/2003 | Asakawa et al. |
| 7,090,784 | B2 | 8/2006 | Asakawa et al. |
| 7,097,781 | B2 | 8/2006 | Asakawa et al. |
| 7,405,160 | B2 | 7/2008 | Kozuka et al. |
| 7,517,466 | B2 | 4/2009 | Asakawa et al. |
| 8,043,520 | B2 | 10/2011 | Asakawa et al. |
| 8,394,877 | B2 | 3/2013 | Asakawa et al. |
| 8,435,416 | B2 | 5/2013 | Asakawa et al. |
| 2003/0222048 | A1 | 12/2003 | Asakawa et al. |
| 2004/0050816 | A1 | 3/2004 | Asakawa et al. |
| 2005/0082256 | A1 | 4/2005 | Honda et al. |
| 2006/0231525 | A1 | 10/2006 | Asakawa et al. |
| 2007/0165827 | A1 | 7/2007 | Worsham et al. |

(Continued)

FOREIGN PATENT DOCUMENTS

JP     6-151383     5/1994

OTHER PUBLICATIONS

Wikipedia, The Free encyclopedia, "Poly(methyl methacrylate)", http://en.wikipedia.org/wiki/Poly(methyl_methacrylate) ; pp. 1-14; 2014.*

(Continued)

*Primary Examiner* — Binh X Tran
(74) *Attorney, Agent, or Firm* — Finnegan, Henderson, Farabow, Garrett & Dunner, L.L.P.

(57) ABSTRACT

According to one embodiment, a pattern formation method includes forming a layer above an underlying layer. The layer includes a block copolymer. The method further includes forming a first phase including a first polymer and a second phase including a second polymer in the layer by phase-separating the block copolymer, and selectively removing the first phase by dry etching the layer using an etching gas including carbon monoxide.

13 Claims, 16 Drawing Sheets

(56) References Cited

U.S. PATENT DOCUMENTS

| | | | |
|---|---|---|---|
| 2009/0130380 A1 | 5/2009 | Asakawa et al. | |
| 2011/0006284 A1* | 1/2011 | Cho et al. | 257/14 |
| 2012/0037594 A1 | 2/2012 | Asakawa et al. | |
| 2012/0037595 A1 | 2/2012 | Asakawa et al. | |
| 2012/0041121 A1 | 2/2012 | Asakawa et al. | |
| 2012/0127454 A1 | 5/2012 | Nakamura et al. | |
| 2013/0078576 A1* | 3/2013 | Wu et al. | 430/296 |
| 2013/0088667 A1* | 4/2013 | Kong et al. | 349/96 |
| 2013/0273476 A1* | 10/2013 | Minegishi et al. | 430/323 |
| 2013/0288482 A1* | 10/2013 | Nam et al. | 438/703 |

OTHER PUBLICATIONS

Wikipedia, The Free Encyclopedia; Polystyrene; http://en.wikipedia.org/wiki/Polystyrene ; pp. 1-14; 2014.*

Yamashita et al., "Exploration of Suitable Dry Etch Technologies for Directed Self-Assembly," Proc. Of SPIE (2012), 8328:1-9.

Chan et al., "High selective plasma etching for PMMA of block-copolymer in Directed-Self Assembly," International Symposium on Dry Process (2012), pp. 5-6.

Ting et al., "Plasma etch removal of poly(methyl methacrylate) in block copolymer lithography," J. Vac. Sci. Technol. B (Sep./Oct. 2008), pp. 1684-1689.

* cited by examiner

CO/H$_2$=0/300

CO/H$_2$=75/225

CO/H$_2$=150/150

CO/H$_2$=225/75

CO/H$_2$=300/0

CO/H$_2$=0/300

CO/H$_2$=75/225

CO/H$_2$=150/150

CO/H$_2$=225/75

CO/H$_2$=300/0

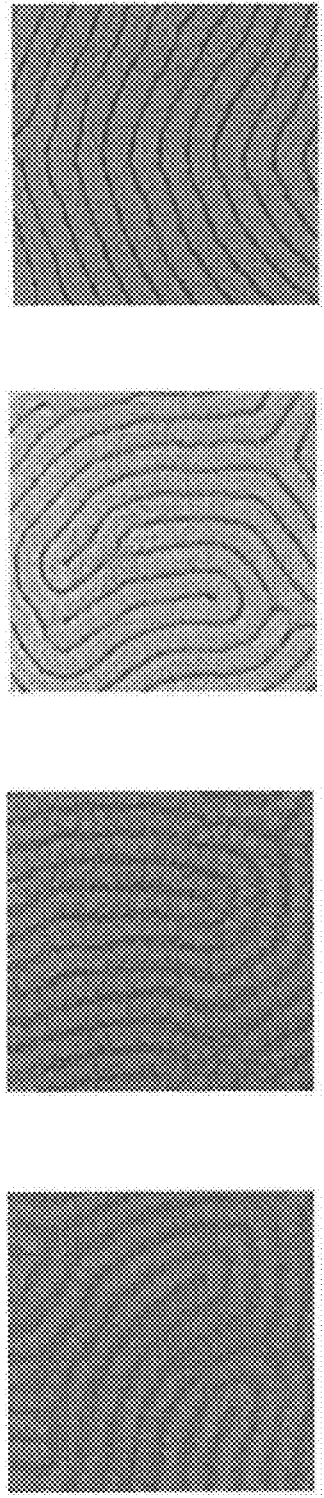
FIG. 15A  CO/H₂=0/300
FIG. 15B  CO/H₂=75/225
FIG. 15C  CO/H₂=150/150
FIG. 15D  CO/H₂=225/75

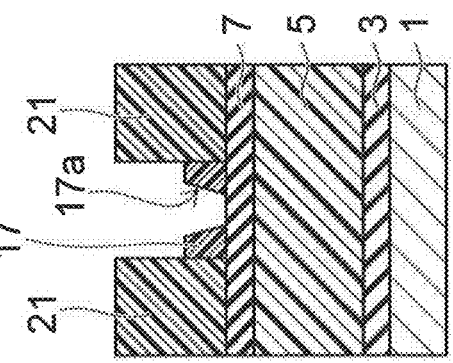
FIG. 19D
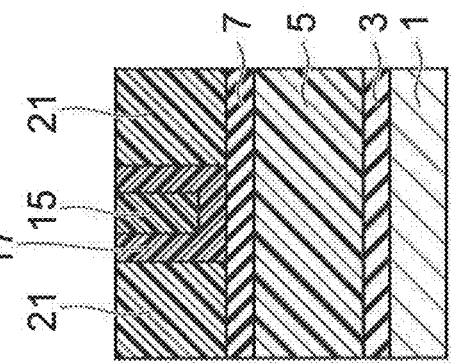
FIG. 19C
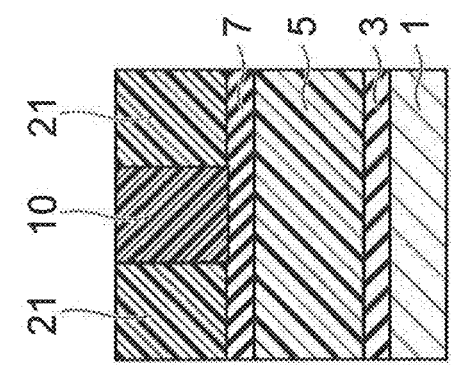
FIG. 19B
FIG. 19A

PATTERN FORMATION METHOD

CROSS-REFERENCE TO RELATED APPLICATIONS

This application is based upon and claims the benefit of priority from Japanese Patent Application No. 2013-142565, filed on Jul. 8, 2013; the entire contents of which are incorporated herein by reference.

FIELD

Embodiments described herein relate generally to a pattern formation method.

BACKGROUND

Micro-fabrication technologies based on self-organization of block copolymers have been developed for advancing miniaturization and integration in semiconductor devices. The block copolymer includes plural kinds of polymers, and can be subjected to micro-phase separation by e.g. heat treatment. Thus, forming fine patterns beyond photolithography technologies can be realized by selectively removing one of the micro-phase separated phases. However, there is still room for improving the micro-fabrication technology based on block copolymers.

BRIEF DESCRIPTION OF THE DRAWINGS

FIGS. 12A to 15D are SEM images showing wafers according to the second embodiment;
FIGS. 19A to 19D are schematic sectional views showing a process for manufacturing a semiconductor device according to a third embodiment.

DETAILED DESCRIPTION

Figure 1A:
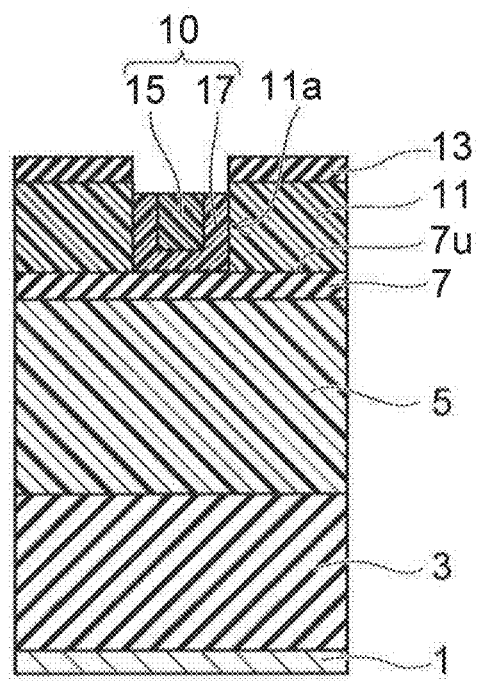
FIGS. 1A to 2C are schematic sectional views showing a process for manufacturing a semiconductor device according to a first embodiment.

According to one embodiment, a pattern formation method includes forming a layer above an underlying layer. The layer includes a block copolymer. The method further includes forming a first phase including a first polymer and a second phase including a second polymer in the layer by phase-separating the block copolymer, and selectively removing the first phase by dry etching the layer using an etching gas including carbon monoxide.

Various embodiments will be described hereinafter with reference to the accompanying drawings. Like portions in the drawings are labeled with like reference numerals, with the detailed description thereof omitted appropriately, and the different portions are described. The drawings are schematic or conceptual. The relationship between the thickness and the width of each portion, and the size ratio between the portions, for example, are not necessarily identical to those in reality. Furthermore, the same portion may be shown with different dimensions or ratios depending on the figures.

First Embodiment

A method for manufacturing a semiconductor device according to the embodiment is described with reference to FIGS. 1A to 2C.

FIGS. 1A to 2C are schematic sectional views showing a process for manufacturing a semiconductor device according to the embodiment.

The method for manufacturing a semiconductor device according to the embodiment includes a process for forming a prescribed pattern in e.g. a semiconductor wafer or a structural body provided thereon. The following description describes a process for forming an opening in a silicon oxide film 3 provided on a semiconductor wafer 1. However, the embodiment is not limited thereto. For example, the embodiment is also applicable to the case, where forming a prescribed pattern in an insulating film, semiconductor layer, or metal film instead of the silicon oxide film 3. Alternatively, the pattern can also be formed in a semiconductor wafer.

First, a first film (hereinafter, silicon oxide film 3) is formed on a semiconductor wafer 1. The silicon oxide film 3 is formed using e.g. plasma CVD technique.

Next, a second film (hereinafter, organic film 5) is formed on the silicon oxide film 3. The organic film 5 is formed using e.g. CVD technique. Furthermore, a third film (hereinafter, silicon oxide film 7) is formed on the organic film 5. The silicon oxide film 7 is formed using e.g. spin coating technique.

Next, a fourth film (hereinafter, guide film 11) and a fifth film (hereinafter, silicon oxide film 13) are sequentially formed on the silicon oxide film 7. The guide film 11 is e.g. a resist film. The guide film 11 and the silicon oxide film 13 are each formed using e.g. spin coating technique.

Subsequently, as shown in FIG. 1A, a first pattern, for example, an opening 11a is formed using photolithography in the guide film 11 and the silicon oxide film 13. The first pattern is e.g. a hole piercing through the silicon oxide film 13 and the guide film 11, and communicating with the silicon oxide film 7. The first pattern is not limited to a hole, but may be a groove extending along the upper surface 7u of the silicon oxide film 7, for example.

Next, a layer 10 including a block copolymer is formed on the underlying layer which has a structure formed through the above process.

The block copolymer includes plural kinds of polymers. The polymers are chemically bonded to each other. For example, a layer 10 including the block copolymer is formed in the opening 11a by applying a solution dissolving the block copolymer to the underlying layer, and evaporating solvent therefrom.

The block copolymer includes two polymers A and B having a carbon-based main chain, for example. The first polymer (hereinafter, polymer A) is e.g. PMMA (polymethylmethacrylate) shown in FIG. 7A. The second polymer (hereinafter, polymer B) is e.g. polystyrene shown in FIG. 7B.

Subsequently, the layer 10 is separated into a first phase 15 including polymer A and a second phase 17 including polymer B by performing heat treatment on the layer 10. That is, the block copolymer is heated to a temperature more than or equal to the glass transition temperature Tg. This causes the phase separation due to the repulsive force between polymers in the vitrified layer.

The method and atmosphere used for heating the block copolymer are not particularly limited. For example, the block copolymer is heated in a forming gas in which a reducing gas such as hydrogen is mixed with an inert gas. The atmosphere during annealing may be a vacuum, or include an inert gas such as argon and nitrogen. The annealing apparatus can be e.g. an oven or hot plate.

For example, when the affinity of the guide film 11 and the silicon oxide film 7 for polymer B is higher than that for polymer A, then as shown in FIG. 1A, polymer B covers the inner surface of the opening 11a to form a second phase 17. Polymer A concentrates inside polymer B covering the opening 11a to form a first phase 15.

Thus, the guide film 11 and the silicon oxide film 7 may serve as a physical guide. The physical guide is a relief structural body formed so as to regularly align the orientation of the block copolymer. One of the polymers is arranged along the portion of this structural body having a high affinity therefor. The portion of the structural body serves as a starting point in order to regularly arrange the block copolymer.

For example, when the affinity of the guide film 11 and the silicon oxide film 7 for polymer A is higher than that for polymer B, and then the inner surface of the opening 11a is covered with polymer A. Polymer B concentrates inside polymer A, forming a reversed phase composition. The guide film 11 may be made of a material having an affinity for polymers A and B, which is different from an affinity of the silicon oxide film 7.

Figure 1B:
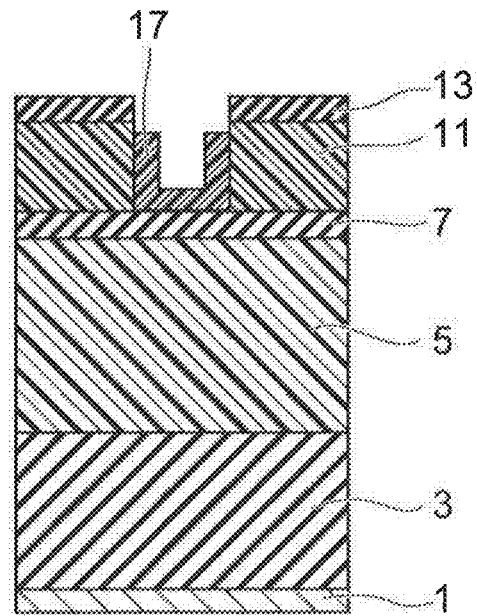

Next, as shown in FIG. 1B, the layer 10 is dry etched to selectively remove the first phase 15. For example, the etching rate of PMMA is faster than that of polystyrene (PS) in dry etching using a gas containing carbon monoxide (CO). Thus, the first phase 15 including PMMA (polymer A) can be selectively removed, leaving the second phase 17 including polystyrene (polymer B) on the inner surface of the opening 11a. Thus, a second opening (hereinafter, opening 17a) is formed inside the second phase 17.

Specifically, for example, a gas of carbon monoxide diluted with an inert gas such as argon (Ar) is used as the etching gas. Alternatively, carbon monoxide may be used without dilution. The dry etching apparatus can be e.g. a CCP (capacitive coupled plasma) type RIE (reactive ion etching) apparatus.

Figure 2A:
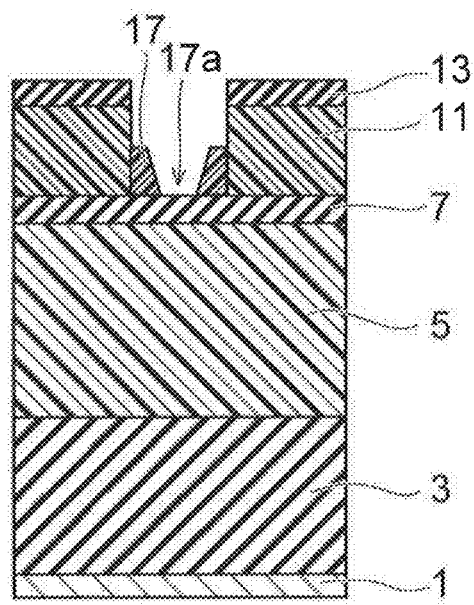

Next, as shown in FIG. 2A, an opening 17a is formed to be in communication with the silicon oxide film 7. For example, the second phase 17 is selectively removed using an anisotropic RIE condition in part where the second phase 17 is in contact with the silicon oxide film 7. For example, a mixed gas of Ar and oxygen is used for the etching gas.

The opening 17a is so called a shrink pattern, which is a second pattern having a smaller diameter than the opening 11a formed using the photolithography.

Figure 2B:
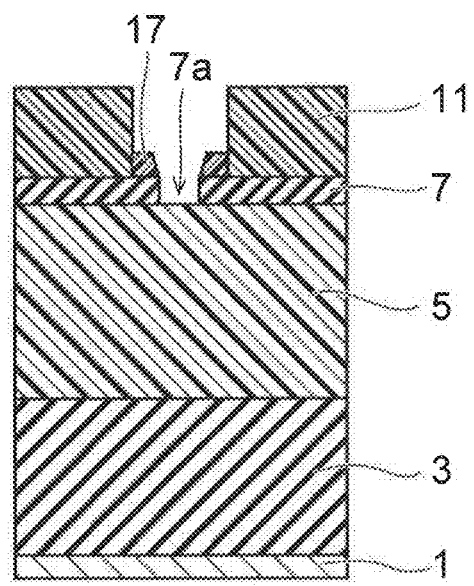

Subsequently, as shown in FIG. 2B, the second phase 17 and the guide film 11 are used as a mask for etching the silicon oxide film 7 exposed at the bottom surface of the opening 17a. For example, the silicon oxide film 7 is selectively etched using RIE technique in which a mixed gas of $CHF_3$ and oxygen is used as an etching gas. Thus, an opening 7a is formed in the silicon oxide film 7. At this time, the silicon oxide film 13 formed on the guide film 11 is also etched and removed.

Figure 2C:
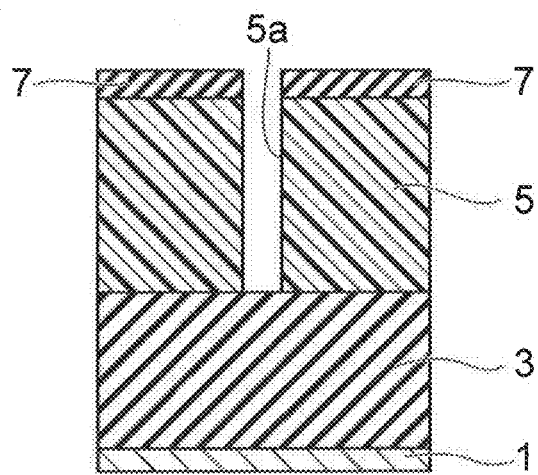

Subsequently, as shown in FIG. 2C, the silicon oxide film 7 with the opening 7a formed therein is used as a mask to selectively etch the organic film 5. Thus, an opening 5a can be formed so as to be in communication with the silicon oxide film 3. The organic film 5 is selectively removed by e.g. dry etching with oxygen. The guide film 11 and the second phase 17 are also simultaneously etched and removed in this process.

The organic film 5 formed in the above process is used as a mask for etching the silicon oxide film 3. The opening 5a is formed by transferring the second pattern in the organic film 5, and has a smaller diameter than that of the opening 11a. That is, a structural body on a semiconductor wafer can be made with the second pattern that is finer than the first pattern formed by photolithography. For example, when the diameter of the opening 11a is the minimum width (resolution limit) in photolithography, the embodiment may realize the miniaturization beyond the photolithography.

Furthermore, in the above manufacturing method, the resolution of the second pattern may be further improved by suppressing excessive etching of the second phase 17. That is, the embodiment may be implemented using a dry etching condition that provides a large etching rate ratio of the first phase 15 to the second phase 17. It may be possible to suppress shoulder rounding and side etching of the second phase 17 during selectively removing the first phase 15. Thus, the dimensional controllability may be improved in the second pattern transferred to the organic film 5.

For example, the oxygen content of polymer A that forms the first phase 15 is preferably higher than the oxygen content of polymer B that forms the second phase 17. This may increase the etching rate ratio of dry etching.

In the embodiment, PMMA used for polymer A includes oxygen in the chemical formula thereof. On the other hand, polystyrene used for polymer B includes no oxygen in the chemical formula thereof. For example, PMMA in actual use includes oxygen atoms at 27.3% (carbon atoms at 72.7%) with respect to the total amount of carbon atoms and oxygen atoms in actual measurement. However, even if residual oxygen and the like are contained in polystyrene, the content thereof is extremely low (e.g., 0.26%). Here, each content (atm %) of carbon atoms and oxygen atoms is a value determined, for example, by X-ray photoelectron spectroscopy (XPS).

From a different viewpoint, a first value is defined in a first monomer (hereinafter, monomer A) as the total number of atoms divided by the number of atoms obtained by subtracting the number of oxygen atoms from the number of carbon atoms, wherein the monomer A constitutes the polymer A. A second value is defined in a second monomer (hereinafter, monomer B) as the total number of atoms divided by the number of atoms obtained by subtracting the number of oxygen atoms from the number of carbon atoms, wherein the monomer B constitutes the polymer B. Then, the first value is preferably larger than the second value.

For example, resistance of a polymer against the dry etching can be evaluated by the index FD represented by the following equation (1).

$$FD = N_T/(N_C - N_O) \qquad (1)$$

Here, $N_T$ is the total number of atoms of a unit monomer constituting the polymer. $N_C$ is the number of carbon atoms included in the unit monomer. $N_O$ is the number of oxygen atoms included in the unit monomer.

In general, resistance of a polymer against a dry etching is correlated with the content of oxygen atoms in the polymer. The dry etching resistance of the polymer decreases with an increase of the FD value. Thus, it may be possible to enlarge the etching rate ratio in the dry etching by combining at least two polymers, wherein each polymer has the FD value separated from the other so that the ratio of FD values is preferably 1.4 or more. For example, the unit monomer of PMMA is $C_5O_2H_8$, and the FD value thereof is 5 (first value). On the other hand, the unit monomer of polystyrene is $C_8H_8$, and the FD value thereof is 2 (second value).

Figure 7A:
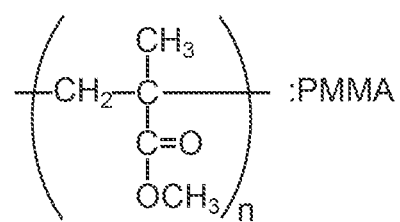
FIGS. 7A and 7B are chemical formulae showing components of block copolymer.
Figure 7B:
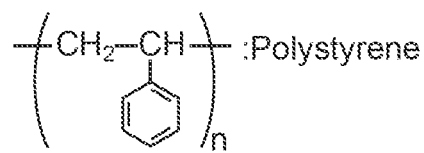

Furthermore, as shown in FIG. 7B, polystyrene includes a benzene ring. On the other hand, as shown in FIG. 7A, PMMA includes no benzene ring. That is, the FD value of a polymer including a benzene ring tends to be smaller than the FD value of a polymer including no benzene ring.

Next, dry etching characteristics of the block copolymer according to the embodiment are described with reference to FIGS. 3 to 5B. FIGS. 3 to 5B are graphs showing the dry etching characteristics of PMMA and polystyrene according to the embodiment.

Figure 3:
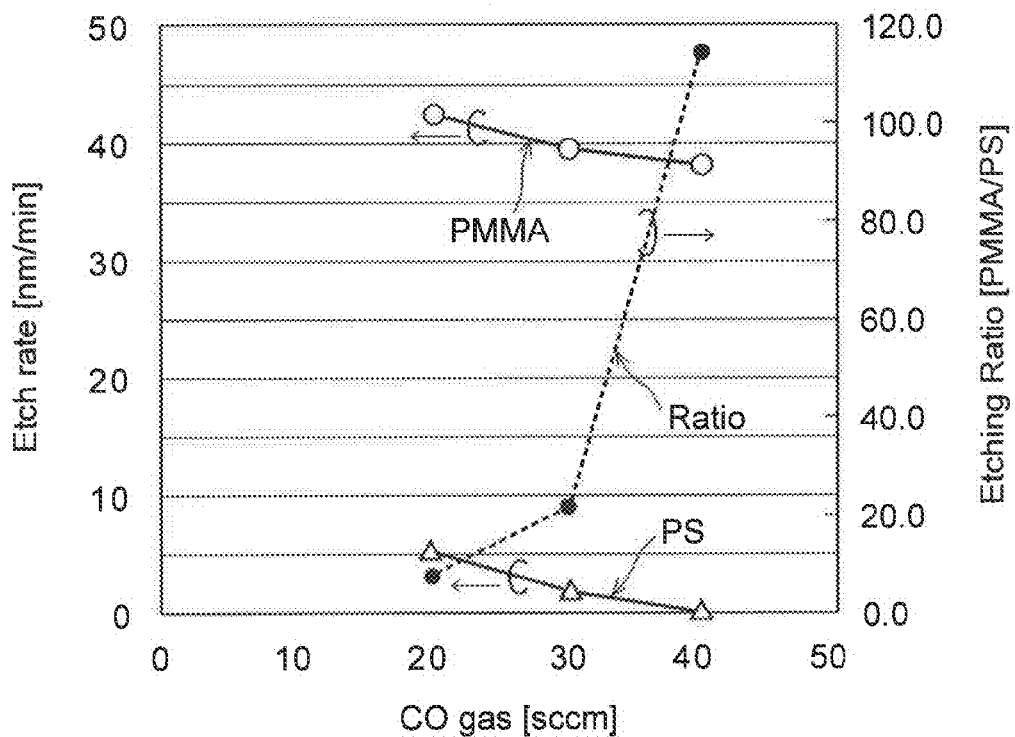
FIGS. 3 to 5B are graphs showing dry etching characteristics of PMMA and polystyrene according to the first embodiment.

FIG. 3 is a graph showing the etching rate of PMMA and polystyrene with respect to the flow rate of carbon monoxide (CO). The horizontal axis represents the flow rate of CO gas (sccm). The vertical axis represents an etching rate (nm/mm) and an etching rate ratio.

A CCP type dry etching apparatus is used in this example. The etching condition is as follows.

Radio frequency (RF) power for plasma excitation at 100 MHz: 700 W
  RF power for bias at 13 MHz: 80 W
  Etching gas pressure: 10 mTorr
  Dilution gas (Ar) flow rate: 265 sccm
  Etching time: 120 seconds As shown in FIG. 3, the etching rate ratio of PMMA to polystyrene increases with an increase of the flow rate of CO gas. In particular, the etching rate ratio significantly increases around the point where the flow rate of CO gas exceeds 30 sccm. Thus, the lower limit of the proportion of CO gas in the etching gas (CO+Ar) is preferably set to approximately 10%, corresponding to a CO gas flow rate of 30 sccm.

For example, in the case of using oxygen ($O_2$) instead of CO gas, the etching rate ratio is 4 or less. That is, the etching rate ratio of PMMA to polystyrene can be increased by one order of magnitude or more by using the etching gas including carbon monoxide (CO).

Figure 4:
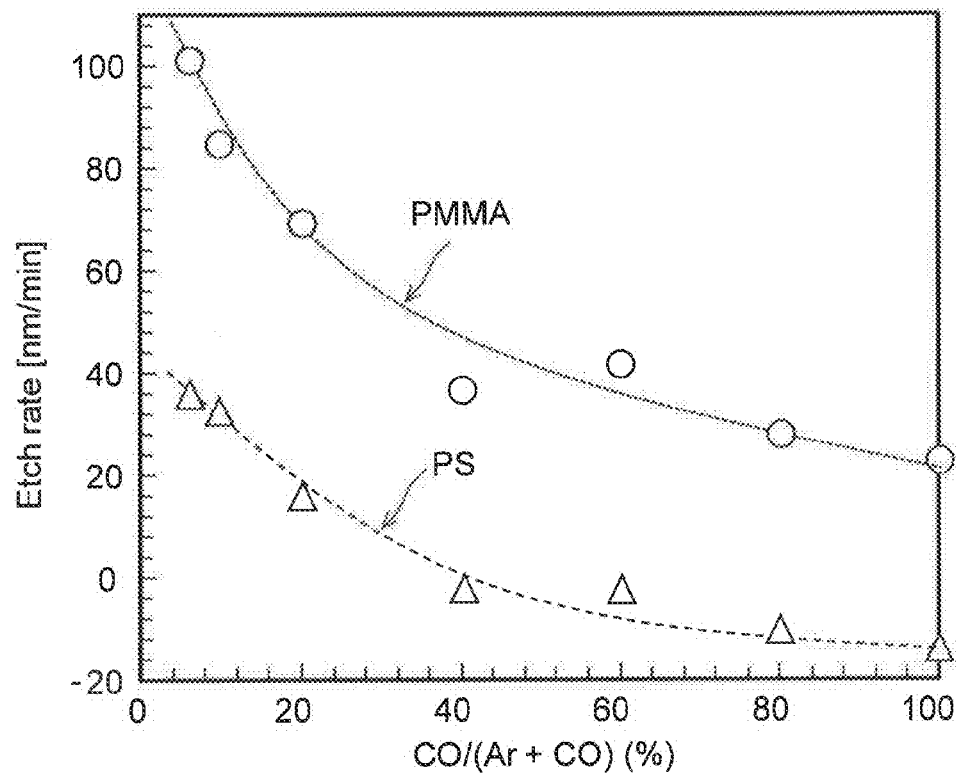

FIG. 4 is a graph showing the etching rates of PMMA and polystyrene according to an alternative example. The horizontal axis represents the proportion (%) of CO gas in the etching gas. The vertical axis represents each etching rate (nm/min).

In the region where the flow rate of CO gas is low, both the etching rates of PMMA and polystyrene is fast. Thus, this example is based on a condition in which the amount of deposits associated with plasma generation in the dry etching apparatus is relatively small.

The dry etching condition in this example is as follows.
  RF power for plasma excitation at 100 MHz: 700 W
  RF power for bias at 13 MHz: 75 W
  Etching gas pressure: 10 mTorr
  Etching gas (CO+Ar) flow rate: 300 sccm As shown in FIG. 4, the etching rate of both PMMA and polystyrene becomes slower with the increase of the proportion (%) of CO gas. When the proportion of CO gas is increased to 40% or more, the etching rate of polystyrene becomes negative. This means that when the proportion of CO gas exceeds 40%, a carbon film is deposited on polystyrene and the film thickness becomes thicker. That is, even under the etching condition with a small amount of deposits, the state of etching only PMMA without etching polystyrene (complete selective etching) can be realized when the proportion of CO gas exceeds 40%. Thus, it can be said to be more preferable to set the proportion of CO gas to 40% or more.

Here, the diluting gas for CO gas is not limited to Ar. For example, an inert gas such as noble gas can be used instead of Ar, or in combination with Ar.

Also in this case, the proportion of CO gas in the total amount of CO gas and the inert gas is preferably set to 10% or more, and more preferably set to 40% or more.

Also under the condition of not diluting CO gas (the proportion of CO gas: 100%), PMMA can be etched. Also in this case, polystyrene is not etched, and complete selective etching of PMMA can be realized. In contrast, for example, both PMMA and polystyrene are etched in the case of using carbon dioxide ($CO_2$) without dilution. The etching rate ratio of PMMA to polystyrene is approximately 1.6.

For example, the dissociation process of carbon monoxide and carbon dioxide in plasma is represented by the following formulas (2) and (3).

$$CO \rightarrow C+O (\Delta H=1076.4 \text{ kJ/mol}) \quad (2)$$

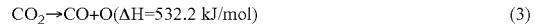

$$CO_2 \rightarrow CO+O (\Delta H=532.2 \text{ kJ/mol}) \quad (3)$$

Here, $\Delta H$ represents the standard enthalpy change of each reaction process. That is, the association-dissociation energy of carbon monoxide is larger than the association-dissociation energy of carbon dioxide. Thus, generation of active oxygen in the plasma is suppressed in the etching gas including carbon monoxide, and the etching rate of the polymer may be decreased. As a result, the etching rate ratio of PMMA to polystyrene may be increased. Here, as long as the etching rate ratio is not significantly decreased, other carbon-based gases such as $CO_2$ may be added to the etching gas in addition to CO gas.

Figure 5A:
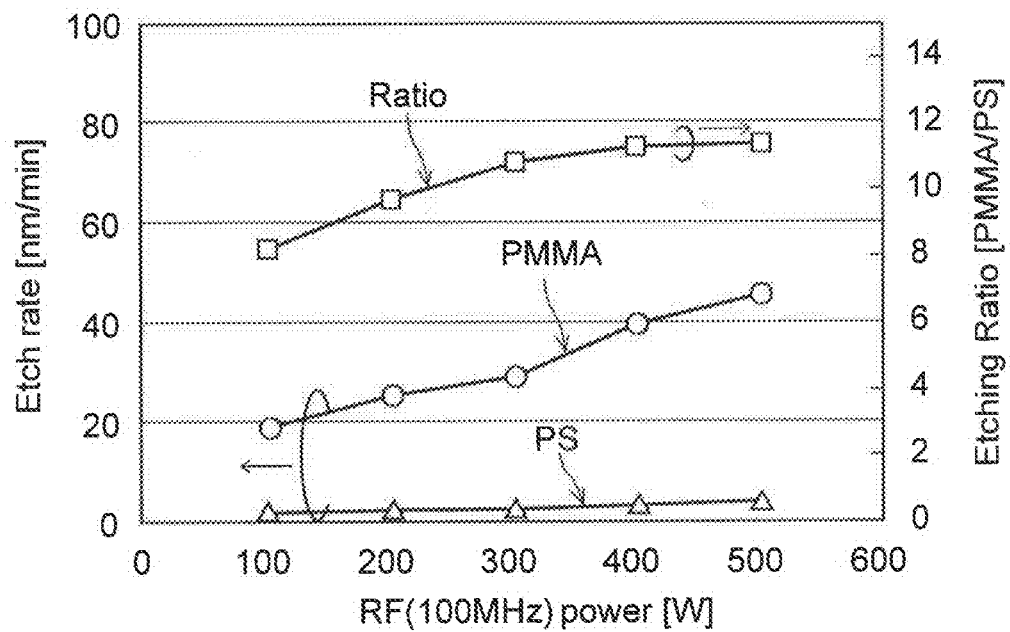
Figure 5B:
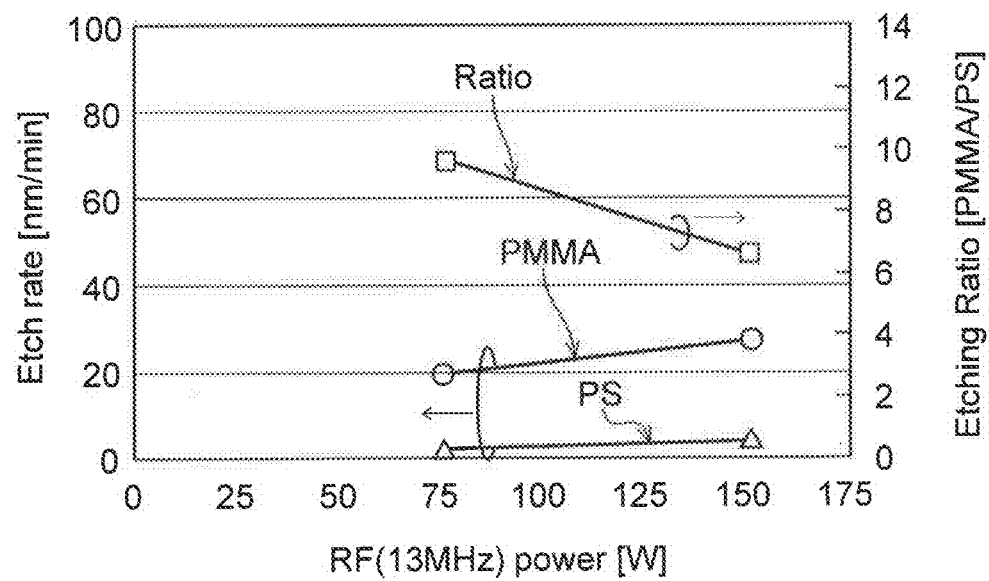

FIGS. 5A and 5B are graphs showing the relation of the etching rates of PMMA and polystyrene to the radio frequency power (RF power) supplied to the CCP type RIE apparatus. FIG. 5A shows the relation of each etching rate to the RF power supplied for plasma excitation. FIG. 5B shows the relation of each etching rate to the RF power supplied for bias. The horizontal axis represents the RF power (W). The vertical axis represents the etching rate (nm/min) and etching rate ratio.

The dry etching condition in this example is as follows.
  Etching gas pressure: 10 mTorr
  Etching gas flow rate; CO gas 20 sccm, Ar gas 265 sccm
  Etching time: 120 seconds As shown in FIG. 5A, the etching rate of PMMA increases with an increase of the RF power for plasma excitation (RF: 100 MHz). In contrast, the etching rate of polystyrene is nearly constant, or slightly increases. As a result, the etching rate ratio of PMMA to polystyrene tends to increases with an increase of the RF power for plasma excitation.

As shown in FIG. 5B, the etching rate of PMMA increases with an increase of the RF bias (RF: 13 MHz), and the etching rate of polystyrene also increases to some extent. On the other hand, the etching rate ratio of PMMA to polystyrene is approximately 10 when the RF bias is set to 75 W. When the RF bias is increased to 150 W, the etching rate ratio decreases to approximately 6.5. That is, when the energy of ions in the plasma is increased by changing the RF bias, the etching rate ratio tends to decrease. Thus, the RF bias power is preferably suppressed to approximately 100 W or less, for example.

Figure 6A:
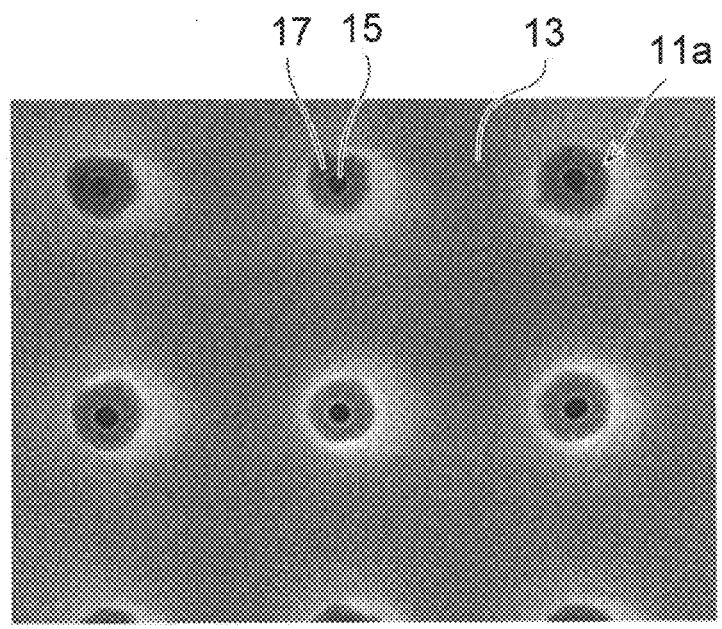
FIGS. 6A and 6B are SEM (scanning electron microscopy) images showing a wafer according to the first embodiment.
Figure 6B:
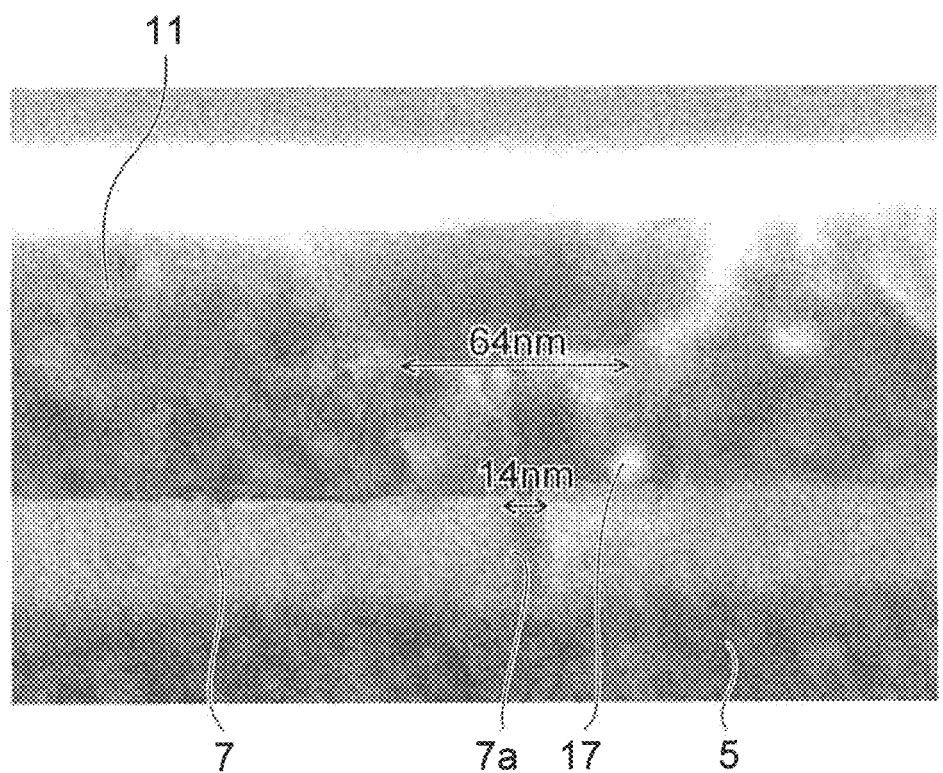

FIGS. 6A and 6B are SEM images showing a wafer according to the embodiment. FIG. 6A is a SEM image showing the upper surface of the wafer. FIG. 5A shows the block copolymer, which is phase-separated into a first phase 15 and a second phase 17. FIG. 6B is a sectional SEM image showing an opening 7a which is formed in the silicon oxide film 7.

As shown in FIG. 6A, the opening 11a is circular. The first phase 15 and the second phase 17 are formed by phase separation inside the opening 11a. The diameter of the opening 11a is approximately 64 nm.

In FIG. 63, with the second phase 17 and the guide film 11 used as a mask, an opening 7a is formed in the silicon oxide film 7. The diameter of the opening 7a is approximately 14 nm.

Thus, it is found in FIG. 6B that the manufacturing method according to the embodiment forms a fine pattern beyond the resolution limit of photolithography. Furthermore, a dry etching gas including carbon monoxide is used so that the etching rate of the first phase 15 with respect to the second phase 17 is set to 10 times or more. This may suppress shoulder rounding and side etching of the pattern in the second phase 17. As a result, the process margin of dry etching is increased, thereby it becomes possible to obtain a fine pattern with desired shape and size.

Second Embodiment

In the embodiment, an etching gas including carbon monoxide and a gas containing a hydrogen atom in the chemical formula representing a composition thereof is used for etching a block copolymer. The embodiment is described below with reference to FIGS. 8 to 18.

Figure 8:
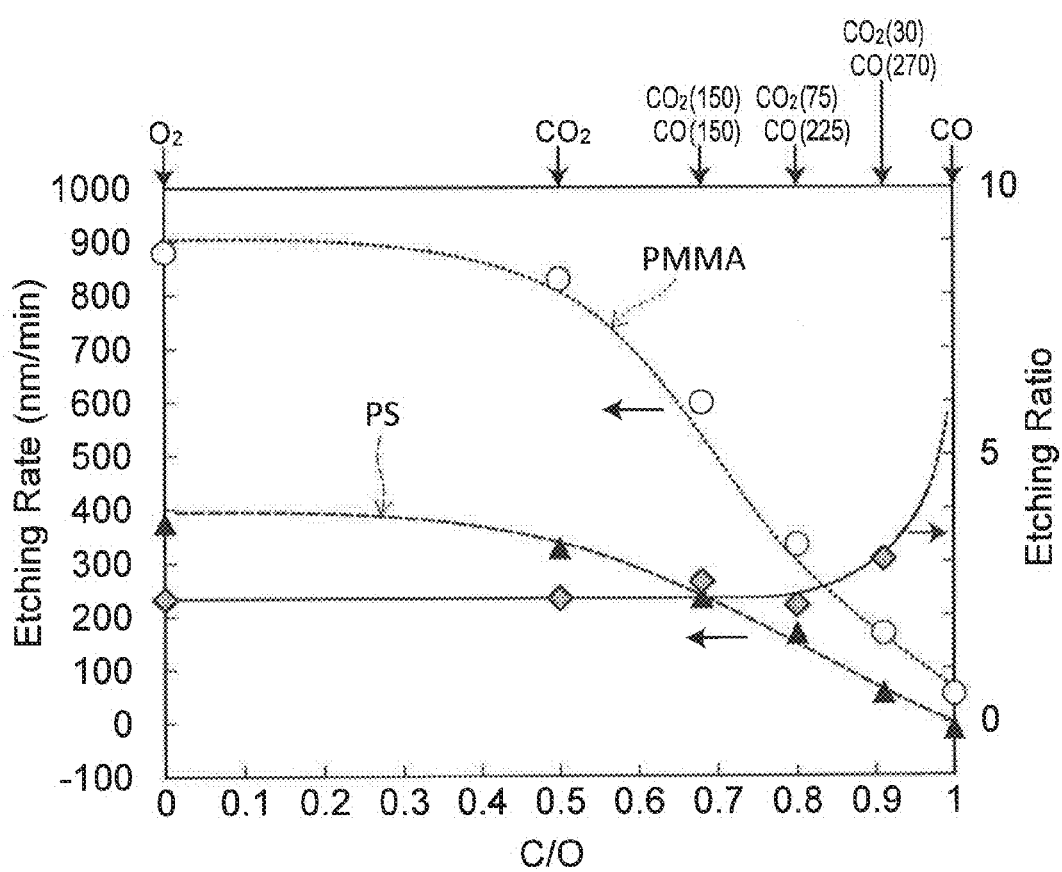
FIGS. 8 to 11 are graphs showing dry etching characteristics according to a second embodiment.
Figure 9:
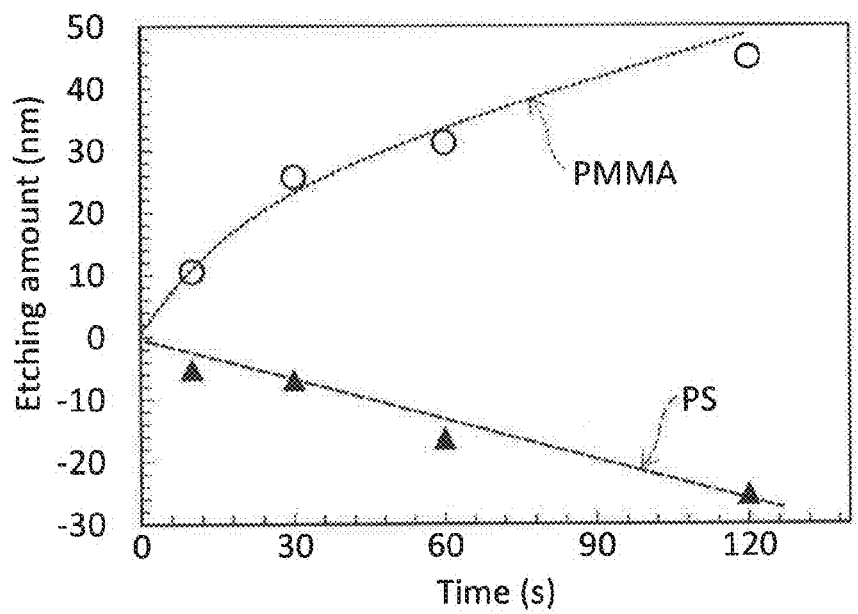
Figure 10:
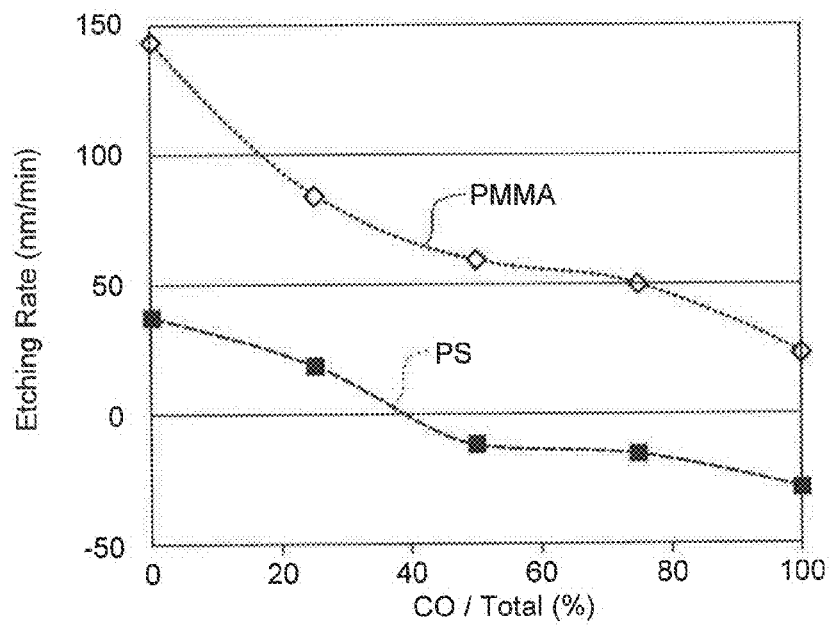

FIGS. 8 to 10 are graphs showing the characteristics of dry etching of PMMA and polystyrene according to the second embodiment.

FIG. 8 is a graph showing the etching rates of PMMA and polystyrene with respect to the ratio of the number of carbon atoms to the number of oxygen atoms (C/O) in the etching gas. The horizontal axis represents the ratio of the number of carbon atoms to the number of oxygen atoms (C/O). The vertical axis represents the etching rate (nm/min) and etching rate ratio.

The etching condition in this example is as follows.
RF power for plasma excitation at 100 MHz: 700 W
RF power for bias at 13 MHz: 75 W
Etching gas pressure: 10 mTorr
Total flow rate of etching gas: 300 sccm In FIG. 8, oxygen ($O_2$) and carbon dioxide ($CO_2$) are mixed in a range where the C/O ratio is 0 to 0.5. The C/O ratio increases with an increase of carbon dioxide ratio in the etching gas. On the other hand, carbon dioxide and carbon monoxide are mixed in a range where the C/O ratio is 0.5 to 1.0. The C/O ratio increases with an increase of carbon monoxide ratio in the etching gas.

As shown in FIG. 8, when the C/O ratio is in the range of 0 to 0.5, the etching rates of PMMA and polystyrene slightly decreases with an increase of the carbon dioxide ratio. When the C/O ratio is in the range of 0.5 to 1.0, the etching rate of both PMMA and polystyrene gradually decreases with an increase of the carbon monoxide ratio. When the ratio of the carbon monoxide reaches 100%, the etching rate of polystyrene becomes negative. That is, a film including carbon atoms (e.g. carbon film) begins to be deposited on the surface of polystyrene.

The etching rate ratio of PMMA to polystyrene shown in FIG. 8 is 2 to 2.6 when the C/O ratio is in the range of 0 to 0.8. However, the etching rate ratio sharply increases when the C/O ratio becomes 0.9 or more.

FIG. 9 is a graph showing the etching characteristics in the case where the carbon monoxide ratio in the etching gas is set to 100%. The horizontal axis represents the etching time (sec). The vertical axis represents the etching amount (nm).

The etching condition in this example is as follows.
RF power for plasma excitation at 100 MHz: 700 W
RF power for bias at 13 MHz: 75 W
Etching gas pressure: 10 mTorr
Total flow rate of etching gas: 300 sccm As shown in FIG. 9, the etching amount of PMMA increases with passage of the etching time. On the other hand, the etching amount of polystyrene decreases in proportion to the etching time. This may be caused by a carbon film deposited on polystyrene.

Thus, by using carbon monoxide for the etching gas, a carbon film can be selectively deposited on polystyrene while etching PMMA. The carbon film deposited on polystyrene is resistant to oxygen radicals or oxygen ions, for example, and protects polystyrene. Thus, as shown in FIG. 2B, when the guide film 11 and the second phase 17 (polystyrene) are used as a mask for selectively etching the silicon oxide film 7, it may become possible to suppress etching of polystyrene, and to improve size control while forming the opening.

Next, FIG. 10 is a graph showing the etching characteristic of PMMA and polystyrene in the case of using a mixed gas of carbon monoxide and hydrogen ($H_2$). The horizontal axis represents the carbon monoxide ratio with respect to the total amount of the etching gas. The vertical axis represents the etching rates of PMMA and polystyrene.

The etching condition in this example is as follows.
RF power for plasma excitation at 100 MHz: 700 W
RF power for bias at 13 MHz: 0 W
Etching gas pressure: 10 mTorr
Total flow rate of etching gas: 300 sccm As shown in FIG. 10, the etching rates of PMMA and polystyrene decrease with an increase of the carbon monoxide ratio. The etching rate of PMMA remains positive even when the carbon monoxide ratio reaches 100%. However, the etching rate of polystyrene becomes negative when the carbon monoxide ratio is 40% or more. That is, when the carbon monoxide ratio is 40% or more, a carbon film is deposited on polystyrene.

FIGS. 11 to 15D are graphs and SEM images showing the surface characteristics of a block copolymer etched by using a mixed gas of carbon monoxide and hydrogen. The etching condition is the same as that of the example shown in FIG. 10.

Figure 11:
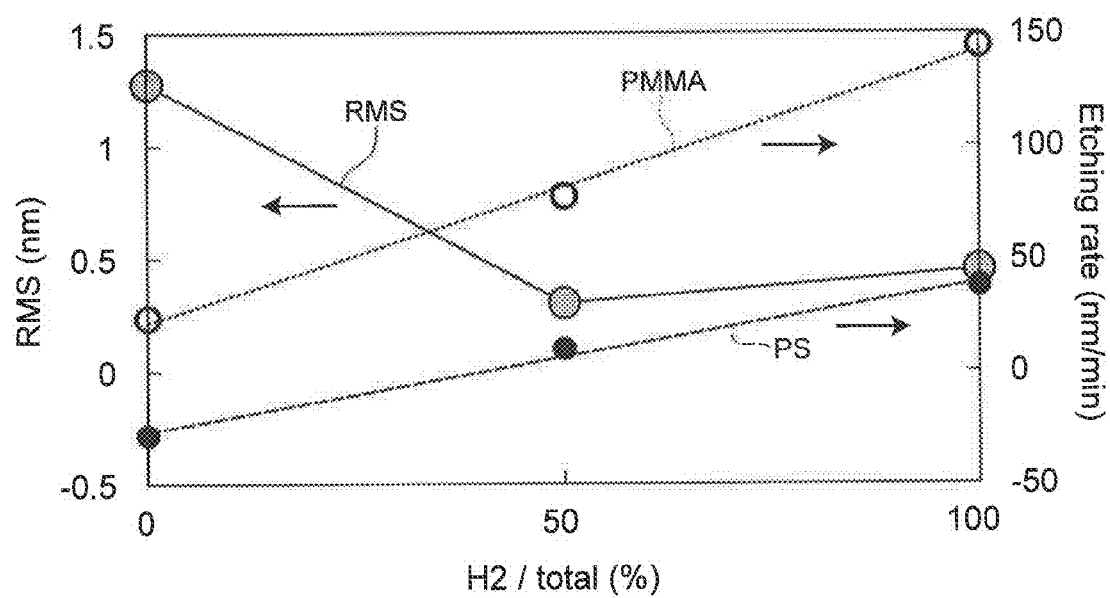

FIG. 11 is a graph showing the relation between the surface roughness of polystyrene after etching and the hydrogen ratio. The horizontal axis represents the hydrogen ratio with respect to the total amount of the etching gas. The vertical axis represents the root mean squared roughness (RMS) at the surface of polystyrene.

As shown in FIG. 11, the etching rates of PMMA and polystyrene increase with an increase of the hydrogen ratio. In the case of polystyrene, when the hydrogen ratio exceeds 50%, deposition of a carbon film turns to etching. The RMS of polystyrene is minimized when the hydrogen ratio is approximately 50%.

Thus, it becomes possible to improve the flatness of the etched surface by setting the hydrogen ratio to approximately 50%.

Figure 12A:
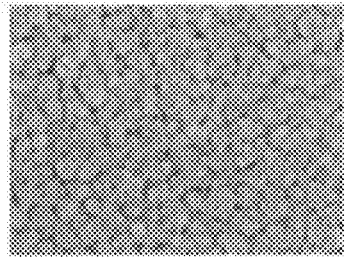
Figure 12B:
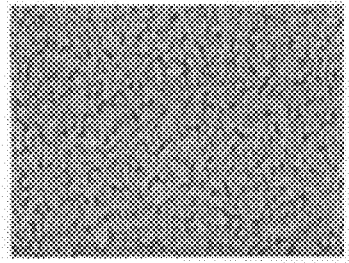
Figure 12C:
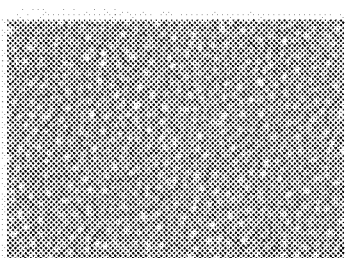

FIGS. 12A to 12C are surface SEM images of polystyrene after etching. FIG. 12A shows the etched surface wherein the hydrogen ratio is set to 0%. FIG. 12B shows the etched surface wherein the hydrogen ratio is set to 50%. FIG. 12C shows the etched surface wherein the hydrogen ratio is set to 100%.

Figure 13A:
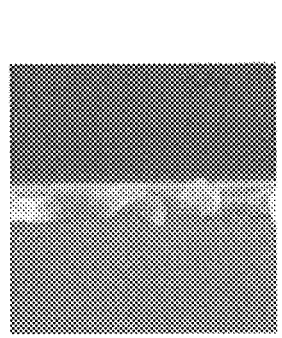
Figure 13B:
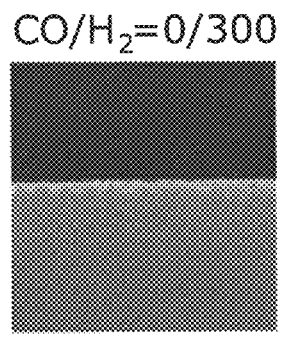
Figure 13C:
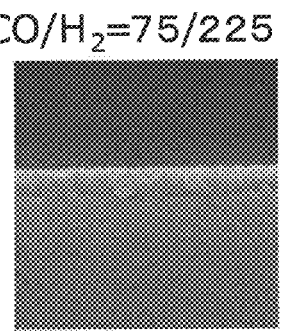
Figure 13D:
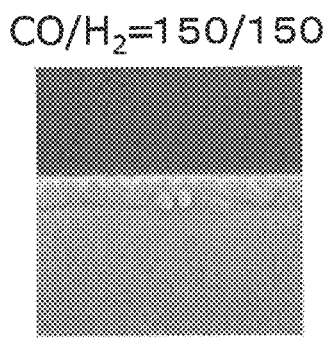
Figure 13E:
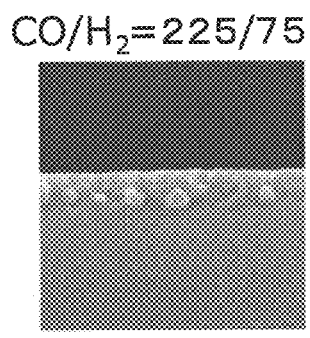
Figure 13F:
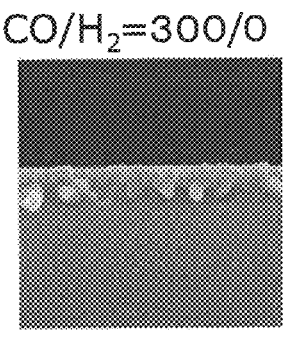

FIG. 13A is a sectional SEM image of a wafer with a block copolymer formed thereon. FIGS. 13B to 13F are sectional SEM images of the wafer after etching the block copolymer. FIG. 13B shows a cross section of the block copolymer etched with a condition in which the carbon monoxide ratio is set to 0% (100% hydrogen). FIG. 13F shows a cross section of the block copolymer etched with a condition in which the carbon monoxide ratio is set to 100%. FIGS. 13C to 13E show cross sections of the block copolymer etched with intermediate conditions therebetween.

FIGS. 13B to 13D show a cross section of the wafer etched under the condition in which PMMA and polystyrene are both etched. FIG. 13B shows a cross section after dry etching with hydrogen, wherein the block copolymer is the thinnest. As shown in FIGS. 13C and 13D, the block copolymer becomes thicker, since the etching rates of PMMA and polystyrene becomes smaller with an increase of the carbon monoxide ratio. In the example shown in FIGS. 13E and 13F, only PMMA is etched.

Figure 14A:
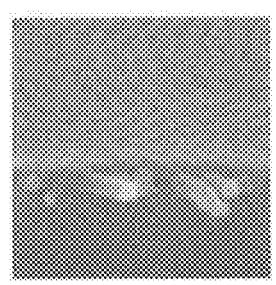

FIGS. 14A to 14F are SEM images showing the surface of the block copolymer as viewed from obliquely above. FIG. 14A shows the block copolymer before etching. FIGS. 14B to 14F show the etched surface of the block copolymer.

Figure 14B:
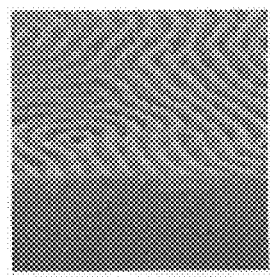
Figure 14C:
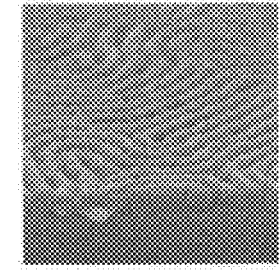
Figure 14D:
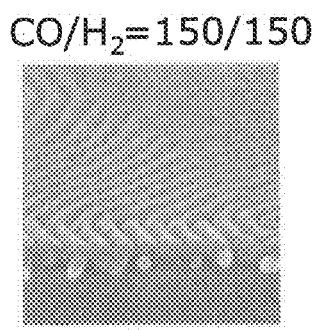

In the example shown in FIGS. 14B to 14D, PMMA and polystyrene are both etched. Under the etching condition in FIGS. 14B and 14C, the etched polystyrene becomes narrower than that in the other examples. That is, the width of the groove after removing PMMA is wider in FIGS. 14B to 14D.

In the example shown in FIG. 14D, the etching rates of PMMA and polystyrene are smaller than that in FIGS. 14B and 14C, and the etching amount of polystyrene is slight. Thus, the groove width after removing PMMA is nearly equal to that of the example of FIGS. 14E and 14F. The RMS is minimized in the surface of remaining polystyrene.

Figure 14E:
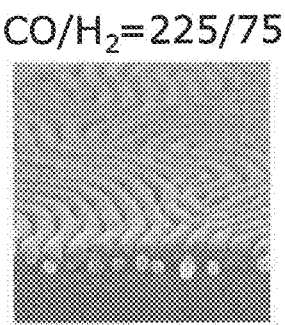
Figure 14F:
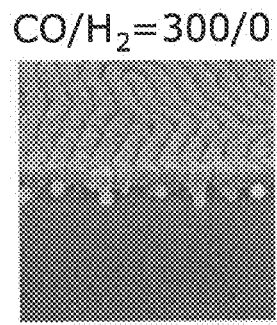

In the examples of FIGS. 14E and 14F, a carbon film is deposited on polystyrene, and only PMMA is etched. In these examples, the unevenness of the polystyrene surface is found to be larger than that in the example shown in FIG. 14D.

Thus, the unevenness of the polystyrene surface can be suppressed by adding hydrogen to the etching gas. For example, when the hydrogen ratio is set to approximately 50%, the polystyrene surface is made the smoothest.

FIGS. 15A to 15D are SEM images showing the surface of the block copolymer after etching. FIGS. 15A and 15B show the surface after etching under the condition in which PMMA and polystyrene are both etched. The etching rates of PMMA and polystyrene decrease with an increase of the amount of carbon monoxide. In the example shown in FIG. 15C, the etching amount of polystyrene is slight. In the example shown in FIG. 15D, only PMMA is etched. A carbon film is deposited on polystyrene.

It can be found that the groove width after removing PMMA in the example of FIGS. 15A and 15B becomes wider than the groove width shown in the example of FIGS. 15C and 15D. Furthermore, the unevenness of polystyrene shown in FIGS. 15A and 15B is also larger than that of the example in FIGS. 15C and 15D.

In the example shown in FIG. 15C, the hydrogen ratio in the etching gas is 50%, and the RMS is minimized. It may be found in FIGS. 15C and 15D that the groove after removing PMMA becomes more uniform in FIG. 15C than that in FIG. 15D.

Figure 16:
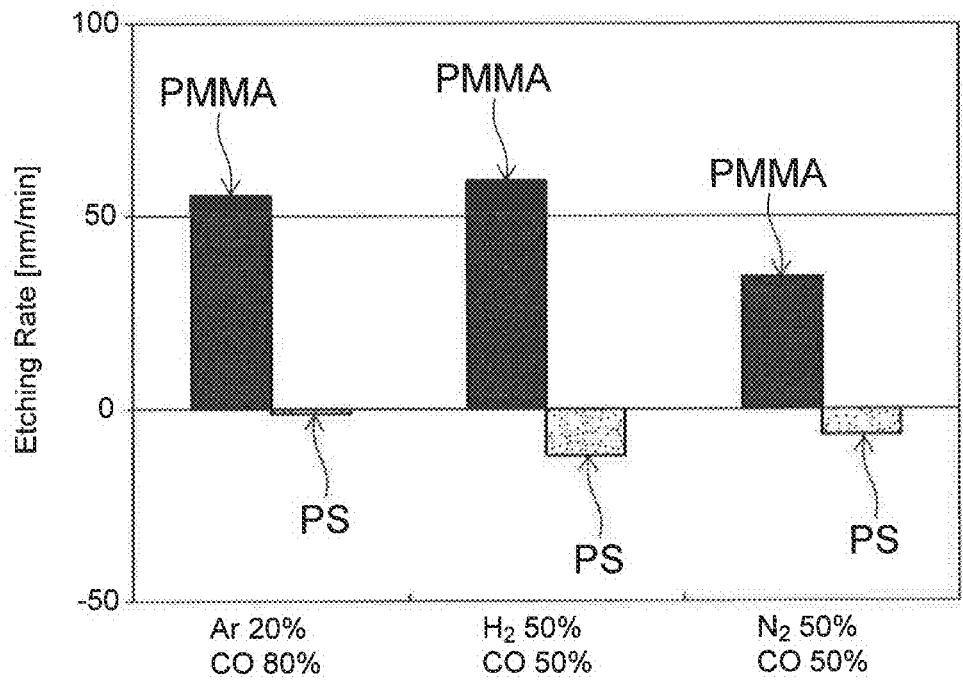
FIGS. 16 to 18 are graphs showing other characteristics of dry etching according to the second embodiment.

Next, FIG. 16 is a graph showing the relation between the gas species for diluting carbon monoxide and the etching rate of the block copolymer. FIG. 16 shows an example of mixing argon (Ar) at 20%, an example of mixing hydrogen at 50%, and an example of mixing nitrogen ($N_2$) at 50%.

As shown in FIG. 16, in any of the examples, the etching rate of PMMA is positive, whereas the etching rate of polystyrene is negative. That is, only PMMA is etched, and a carbon film is formed on polystyrene. The deposition rate of the carbon film on polystyrene is higher in the case of adding hydrogen or nitrogen to carbon monoxide than in the case of adding argon. Thus, a carbon film can be formed thicker on polystyrene by using an etching gas in which carbon monoxide is mixed with hydrogen or nitrogen.

In the case of mixing nitrogen, compared with the case of mixing hydrogen, the etching rate of PMMA is small, while the deposition rate of the carbon film is also small. That is, similar etching characteristics are exhibited in the case of diluting carbon monoxide with nitrogen and in the case of diluting carbon monoxide with hydrogen. Thus, even when carbon monoxide is diluted with a mixed gas of hydrogen and nitrogen, etching characteristics similar to the case of diluting carbon monoxide with only hydrogen may be obtained.

Figure 17:
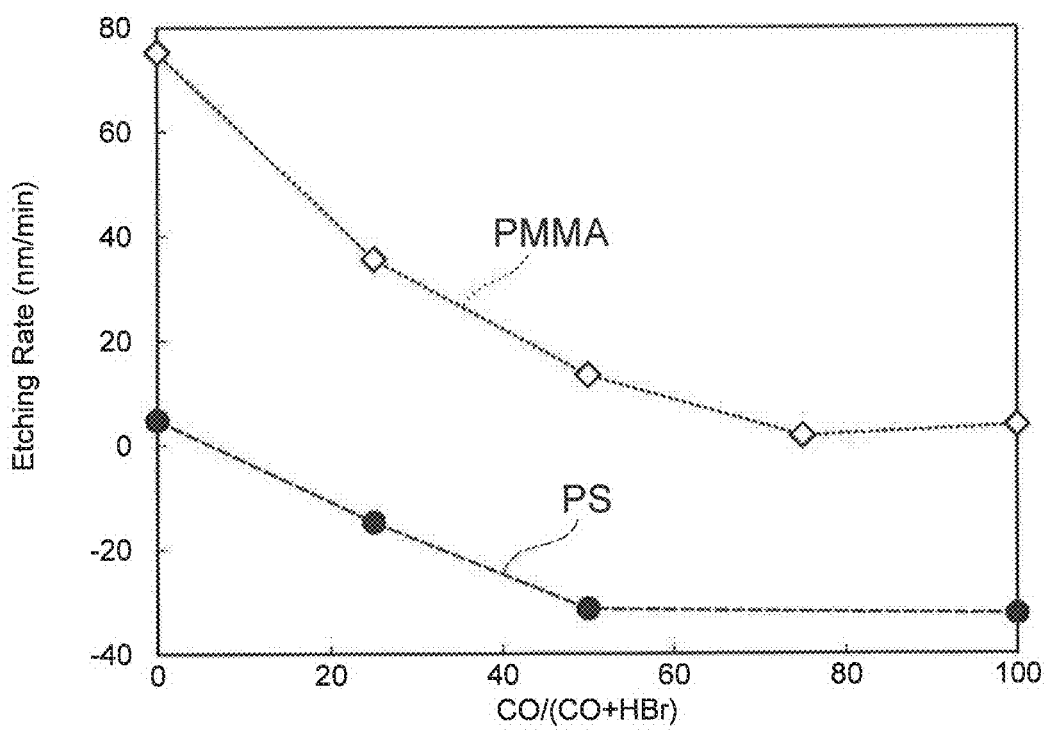

Next, FIG. 17 is a graph showing the etching characteristics in the case of using an etching gas in which carbon monoxide is mixed with hydrogen bromide (HBr). The horizontal axis represents the carbon monoxide ratio with respect to the total amount of the etching gas. The vertical axis represents the etching rate (nm/min). Hydrogen bromide includes a hydrogen atom in a chemical formula thereof. Thus, hydrogen bromide exhibits etching characteristics similar to the case of diluting carbon monoxide with hydrogen.

As shown in FIG. 17, each etching rate of PMMA and polystyrene decreases with an increase of the carbon monoxide ratio. The etching rate of PMMA is positive even when the carbon monoxide ratio is changed. However, the etching rate of polystyrene becomes negative when the carbon monoxide ratio is 5% or more. Thus, in the case of mixing carbon monoxide and hydrogen bromide, a carbon film is deposited on polystyrene when the carbon monoxide ratio is 5% or more.

Figure 18:
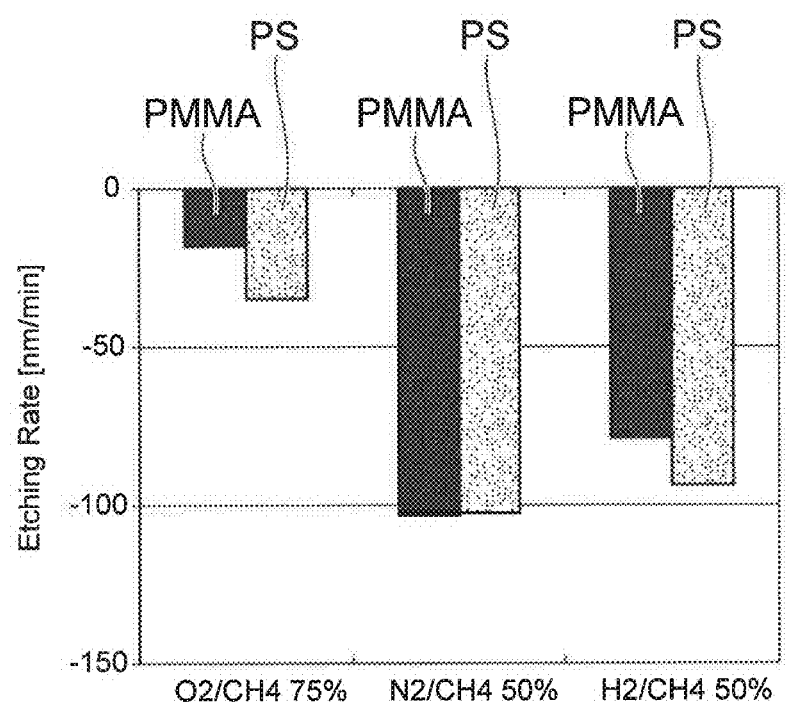

Next, FIG. 18 is a graph showing a relation between the etching rate of the block copolymer and mixed gas, which includes methane ($CH_4$) and one of three kinds of diluting gas. FIG. 18 shows an example of mixing methane with oxygen at 75%, an example of mixing methane with nitrogen at 50%, and an example of mixing methane with hydrogen at 50%.

As shown in FIG. 18, in any of the examples, the etching rate of PMMA and polystyrene is negative. That is, a carbon film is deposited on both of PMMA and polystyrene. The deposition rate is higher in the example of adding nitrogen or hydrogen than that in the example of adding oxygen.

Thus, methane serves to promote the deposition of a carbon film. Thus, a carbon film may be formed thicker on polystyrene by adding methane to the etching gas. For example, an etching gas may be used in which carbon monoxide, hydrogen or nitrogen, and methane are mixed.

Thus, in the embodiment, a mixed gas of carbon monoxide and a gas including hydrogen atom in the chemical formula representing a composition thereof may be used for selectively etching the block copolymer. This can improve the surface state of polystyrene after etching. For example, the surface roughness (RMS) may be minimized by setting the hydrogen ratio in the etching gas to approximately 50%. Furthermore, resistance to dry etching can be improved by forming a film including carbon atoms (carbon film) on polystyrene. Thus, it is possible to form an etching mask with improved dimensional accuracy.

Third Embodiment

A method for manufacturing a semiconductor device according to a third embodiment is described with reference to FIGS. 19A to 19D.

FIGS. 19A to 19D are schematic sectional views showing a process for manufacturing a semiconductor device according to the third embodiment. The embodiment includes a process for forming a prescribed pattern, for example, in a semiconductor wafer or a structural body provided thereon.

As shown in FIG. 19A, a wafer 1 is prepared. The wafer 1 includes a silicon oxide film 3, an organic film 5 formed on the silicon oxide film 3, and a silicon oxide film 7 formed on the organic film 5.

Next, a photosensitive organic material (e.g., photoresist 21) is formed on the silicon oxide film 7. Subsequently, a recess 21a is formed in the photoresist 21 by using photolithography technique. The photoresist 21 is e.g. an ArF resist sensitive to the wavelength band of ArF laser. The recess 21a may be a hole, or a groove extending along the upper surface 7u of the silicon oxide film 7, for example.

Next, as shown in FIG. 19B, a layer 10 including a block copolymer is formed inside the recess 21a formed in the photoresist 21. The block copolymer includes e.g. two polymers A and B having a carbon-based main chain. Polymer A is, for example, PMMA (polymethylmethacrylate) shown in FIG. 7A. Polymer B is, for example, polystyrene shown in FIG. 7B.

Subsequently, as shown in FIG. 19C, the layer 10 is separated into a first phase 15 including polymer A and a second phase 17 including polymer B by implimenting heat treatment on the layer 10.

Next, as shown in FIG. 19D, the layer 10 is dry etched to selectively remove the first phase 15. For example, PMMA is selectively etched by using a mixed gas of carbon monoxide and hydrogen bromide. Thus, the first phase 15 including PMMA (polymer A) is selectively removed, leaving the second phase 17 including polystyrene (polymer B) on the inner surface of the recess 21a. Furthermore, a carbon film is formed on polystyrene. This may improve resistance in the subsequent etching process.

Next, as shown in FIG. 19D, an opening 17a is formed so as to be in communication with the silicon oxide film 7. For example, the second phase 17 is selectively removed in part that is in contact with the silicon oxide film 7 using an anisotropic RIE etching condition. For example, a mixed gas of Ar and oxygen is used for the etching gas. At this time, the carbon film formed on polystyrene protects the second phase 17. This suppresses shoulder rounding and dimensional expansion in the opening 17a.

Subsequently, the second phase 17 and the photoresist 21 are used as a mask for etching the silicon oxide film 7 exposed at the bottom of the opening 17a. For example, the silicon oxide film 7 is selectively etched using RIE technique with a mixed etching gas of $CHF_3$ and oxygen. Furthermore, as shown in FIGS. 2B and 2C, the silicon oxide film 7 is used as a mask for selectively etching the organic film 5.

Figure 20:
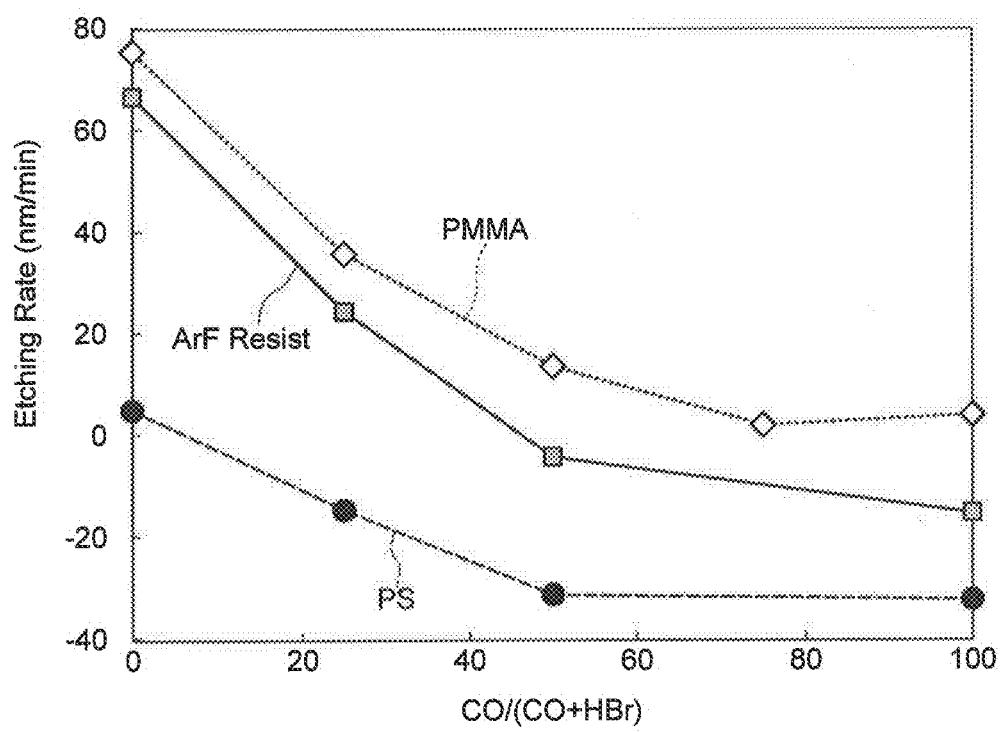
FIG. 20 is a graph showing etching characteristics according to the third embodiment.

FIG. 20 is a graph showing the etching characteristics in the case of using a mixed gas of carbon monoxide and hydrogen bromide (HBr). The horizontal axis represents the carbon monoxide ratio with respect to the total amount of the etching gas. The vertical axis represents the etching rate (nm/min). In addition to the etching rates of PMMA and polystyrene, FIG. 20 shows the etching rate of ArF resist.

As shown in FIG. 20, each etching rate of PMMA, polystyrene, and ArF resist decreases with an increase of the carbon monoxide ratio. The etching rate of PMMA is maintained to be positive while the carbon monoxide ratio is changed 0 to 100%. However, the etching rate of polystyrene becomes negative when the carbon monoxide ratio is 5% or more. The etching rate of ArF resist becomes negative when the carbon monoxide ratio is 45% or more. That is, PMMA can be selectively etched using a condition in which the carbon monoxide ratio is set to 45% or more, and a carbon film may be deposited on polystyrene and ArF resist. This can improve resistance of ArF resist and polystyrene to dry etching.

As described above, in the embodiment, a photoresist 21 serving as a guide film is formed directly on the underlying layer. Thus, a recess (or opening) may be formed directly in the guide film by photolithography technique. This can simplify the manufacturing process.

Furthermore, an etching gas in which carbon monoxide is mixed with a gas including hydrogen in a formula representing composition thereof is used to etch the block copolymer. Thus, a carbon film may be deposited on the second phase 17 and on the photoresist 21. This may improve resistance of the second phase 17 and the photoresist 21 to dry etching.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A pattern formation method comprising:
  forming a layer above an underlying layer, the layer including a block copolymer;
  forming a first phase including a first polymer and a second phase including a second polymer in the layer by phase-separating the block copolymer, the first polymer including no benzene ring in a chemical formula thereof, and the second polymer including a benzene ring in a chemical formula thereof; and
  selectively removing the first phase by dry etching the layer using an etching gas including carbon monoxide and hydrogen, wherein a flow rate ratio of the carbon monoxide to a total amount of the hydrogen and the carbon monoxide is 40% or more.

2. The method according to claim 1, wherein
  each of the first polymer and the second polymer has a carbon-based main chain; the first polymer includes a unit of a first monomer in a chemical formula thereof, and the second polymer includes a unit of a second monomer in a chemical formula thereof; and
  a first value in the first monomer is larger than a second value in the second monomer, each of the first value and the second value being defined as total number of atoms divided by number of atoms obtained by subtracting number of oxygen atoms from number of carbon atoms.

3. The method according to claim 1, wherein the etching gas further includes nitrogen.

4. The method according to claim 1, wherein the etching gas further includes methane.

5. The method according to claim 1, wherein
  the first polymer contains an oxygen atom in a chemical formula thereof, and
  the second polymer contains no oxygen atom in a chemical formula thereof.

6. The method according to claim 1, wherein a carbon-containing film is deposited on the second phase during the dry etching.

7. The method according to claim 1, further comprising:

forming a guide film having a recess above the underlying layer, wherein the layer including the block copolymer is formed in the recess.

8. The method according to claim 7, further comprising:
etching the underlying layer using the guide film and the second phase as a mask.

9. The method according to claim 7, wherein the underlying layer is exposed at a bottom of the recess.

10. The method according to claim 9, wherein the guide film has a higher affinity for the second polymer than for the first polymer.

11. The method according to claim 10, wherein the underlying layer has a higher affinity for the second polymer than for the first polymer.

12. The method according to claim 9, wherein
the guide film includes a photosensitive organic material, and
the recess is formed by using photolithography.

13. The method according to claim 12, wherein a carbon-containing film is deposited on the guide film and on the second phase during the dry etching.

* * * * *